(12) United States Patent
Dia et al.

(10) Patent No.: US 10,361,190 B2
(45) Date of Patent: Jul. 23, 2019

(54) STANDARD CELL CIRCUITRIES

(71) Applicant: MediaTek Inc., Hsin-Chu (TW)

(72) Inventors: Kin-Hooi Dia, Hsinchu (TW); Hugh Thomas Mair, Fairview, TX (US); Shao-Hua Huang, Taipei (TW); Wen-Yi Lin, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/168,507

(22) Filed: May 31, 2016

(65) Prior Publication Data

US 2017/0018572 A1    Jan. 19, 2017

Related U.S. Application Data

(60) Provisional application No. 62/192,745, filed on Jul. 15, 2015.

(51) Int. Cl.
*H03K 19/017* (2006.01)
*H01L 27/06* (2006.01)
*H03K 19/003* (2006.01)

(52) U.S. Cl.
CPC ... *H01L 27/0629* (2013.01); *H03K 19/00361* (2013.01); *H03K 19/00369* (2013.01)

(58) Field of Classification Search
CPC .......... H01L 27/0629; H03K 19/00361; H03K 19/00369
USPC ....................................................... 327/112
See application file for complete search history.

(56) References Cited

U.S. PATENT DOCUMENTS

| | | | | |
|---|---|---|---|---|
| 4,358,728 A | * | 11/1982 | Hashimoto | G04G 19/06 323/275 |
| 4,859,870 A | * | 8/1989 | Wong | H03K 19/00361 326/62 |
| 5,142,251 A | | 8/1992 | Boomer | |
| 5,583,457 A | * | 12/1996 | Horiguchi | G06F 1/3203 326/121 |
| 5,606,292 A | * | 2/1997 | Oh | H03K 3/012 331/108 A |
| 5,614,847 A | * | 3/1997 | Kawahara | H03K 3/356113 326/121 |
| 5,767,728 A | * | 6/1998 | Michail | H03K 19/00361 327/206 |
| 6,255,867 B1 | | 7/2001 | Chen | |
| 6,271,709 B1 | * | 8/2001 | Kimura | H03K 17/168 327/170 |
| 6,369,604 B1 | * | 4/2002 | Schreyer | H03K 17/164 326/27 |
| 6,737,886 B2 | * | 5/2004 | Curatolo | H03K 17/167 326/27 |
| 6,801,073 B2 | * | 10/2004 | Morgan | H03K 5/133 327/288 |
| 6,812,735 B1 | | 11/2004 | Pham | |
| 6,975,153 B2 | * | 12/2005 | Hinterscher | H03K 3/012 327/112 |
| 7,570,085 B2 | * | 8/2009 | Ishikawa | H03K 17/0406 327/108 |

(Continued)

*Primary Examiner* — Ryan Jager
(74) *Attorney, Agent, or Firm* — McClure, Qualey & Rodack, LLP

(57) ABSTRACT

A standard cell circuit includes a standard cell unit and a first resistive device. The standard cell unit is coupled to at least one resistor. The first resistive device is coupled to the standard cell unit and provides a first current path for a first current to flow through.

15 Claims, 13 Drawing Sheets

(56) References Cited

U.S. PATENT DOCUMENTS

| | | |
|---|---|---|
| 8,410,813 B2 | 4/2013 | Zhang et al. |
| 8,754,677 B2 * | 6/2014 | Chen ...................... G05F 1/565 |
| | | 326/83 |
| 9,209,797 B2 * | 12/2015 | Kadowaki ............ H03K 17/223 |
| 2009/0108877 A1 | 4/2009 | Kawagoe et al. |
| 2014/0334214 A1 * | 11/2014 | Katoh ............... H02M 7/53803 |
| | | 363/132 |

* cited by examiner

STANDARD CELL CIRCUITRIES

CROSS REFERENCE TO RELATED APPLICATIONS

This application claims the benefit of U.S. Provisional Application No. 62/192,745 filed on 2015 Jul. 15 and entitled "Standard cell layout with reduced resistance parasitic", and the entire contents of which are hereby incorporated by reference.

BACKGROUND OF THE INVENTION

Field of the Invention

The invention relates to a semiconductor device, and more particularly to a standard cell.

Description of the Related Art

In recent years, the increasing speed and functionality of digital circuits has led to the speeding-up and integration of semiconductor integrated circuit devices. As a circuit grows in size, the layout of the semiconductor integrated circuit device is generally designed using a standard cell library.

A standard cell is a group of transistor and interconnect structures that provides a Boolean logic function (e.g., AND, OR, XOR, XNOR, inverters) or a storage function (flip-flop or latch). However, parasitic resistance in a standard cell layout can increase significantly in advanced process technology (e.g. FinFet technology). This is due to the increased resistive interconnections used inside the standard cell layout, such as the MEOL (middle-end-of-line) and BEOL (back-end-of-line). This parasitic resistance results in poor performance of the standard cell. For example, the response speed of a standard cell unit reduces as the parasitic resistance increases, causing the performance in the response speed of the standard cell element to degrade.

To solve this problem, several new standard cell circuit structures are introduced to reduce parasitic resistance.

BRIEF SUMMARY OF THE INVENTION

Standard cell circuitries are provided. An exemplary embodiment of a standard cell circuit comprises a standard cell unit and a first resistive device. The standard cell unit is coupled to at least one resistor. The first resistive device is coupled to the standard cell unit and providing a first current path for a first current to flow through.

An exemplary embodiment of a standard cell circuit comprises a standard cell unit and a first dummy transistor. The standard cell unit is coupled to at least one resistor. The first dummy transistor is coupled to the standard cell unit.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

As discussed above, the parasitic resistance results in performance degradation in standard cell. To solve this problem, several new standard cell circuit structures are introduced to reduce the parasitic resistance.

Figure 1:
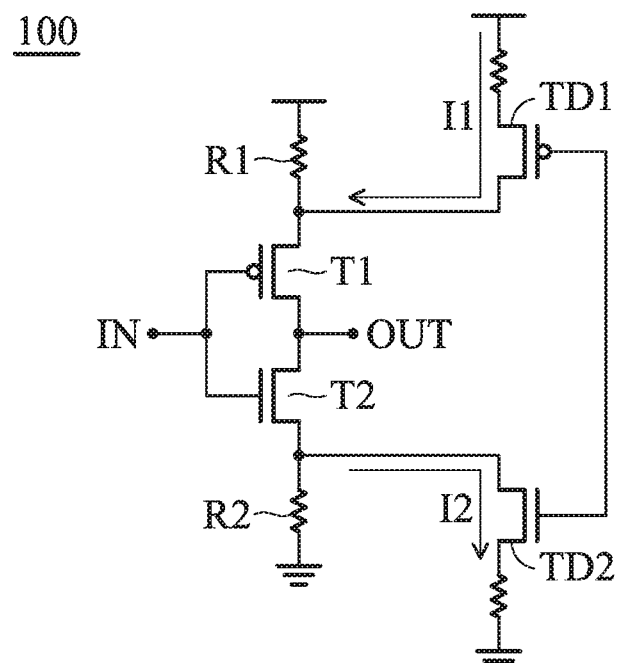
FIG. 1 shows a first exemplary standard cell circuit according to a first embodiment of the invention.

FIG. 1 shows a first exemplary standard cell circuit according to a first embodiment of the invention. The standard cell circuit 100 may comprise at least an input node IN, an output node OUT, a standard cell unit (such as an inverter composed of transistors T1 and T2 as shown in FIG. 1) and at least a resistive device coupled to the standard cell unit for providing a resistive or current path for a current to flow through. According to an embodiment of the invention, the resistive device may be any device that is capable of providing a current path or a resistive path to reduce the overall parasitic resistance of the standard cell circuit 100. For example, although the embodiment is not limited to this example, in one embodiment of the invention, the resistive device may be a transistor (also known as a dummy transistor, since it is an additional device coupled to the standard cell unit and may be or may not be turned on in the embodiments of the invention).

As shown in FIG. 1, in one embodiment of the invention, a dummy transistor TD1 is coupled between a source of the transistor T1 and a power supply and a dummy transistor TD2 is coupled between a source of the transistor T2 and the ground. In some embodiments of the invention, the resistive device and the parasitic resistor such as the resistors R1 and R2) of the standard cell unit may be coupled in parallel. For example, as shown in FIG. 1, the dummy transistor TD1 and the resistor R1 are coupled in parallel between the source of the transistor T1 and the power supply, and the dummy transistor TD2 and the resistor R2 are coupled in parallel between the source of the transistor T2 and the around. A drain of the dummy transistor TD1 is coupled to the source of the transistor T1 and a drain of the dummy transistor TD2 is coupled to the source of the transistor T2. In addition, in the first embodiment of the invention, a gate of the dummy transistor TD1 is coupled to a gate of the dummy transistor TD2. It is noted that the resistors R1 and R2 in the embodiment are used to conveniently represent the parasitic resistor of the standard cell unit, not used to limit the resistors R1 and R2 to be tangible resistor element, or not used to limit the standard cell unit needs to couple to tangible resistor element as shown by R1 and R2.

Since the gate of the dummy transistor TD1 is coupled to the gate of the dummy transistor TD2, the voltage at the gate electrodes of the dummy transistors TD1 and TD2 is floating. Therefore, in this embodiment, the dummy transistors TD1 and TD2 may not be completely turned on. However, as long as the dummy transistors TD1 and/or TD2 are/is turned on, the current I1 and/or I2 can flow through to produce one or more extra resistive or cur current paths in parallel with the resistor R1 and/or R2. In this manner, the parasitic resistance of the standard cell circuit 100 can be reduced.

Note that although the standard cell unit shown in FIG. 1 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 2:
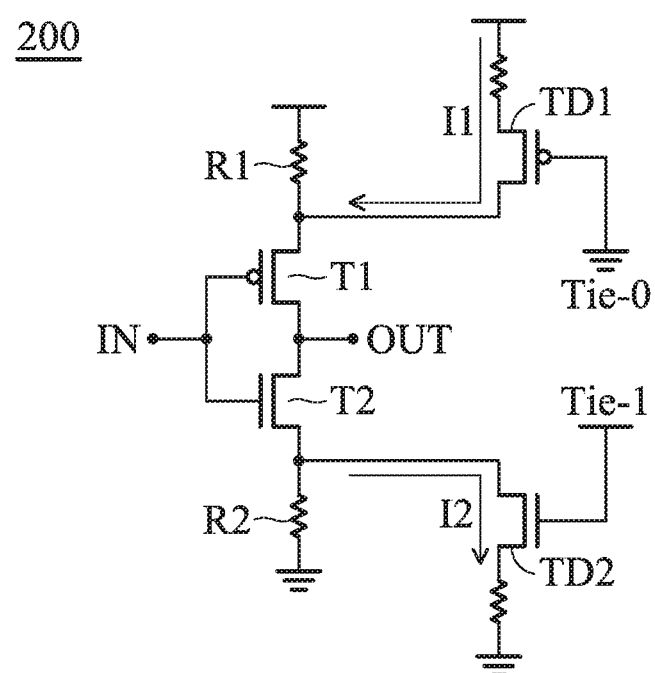
FIG. 2 shows a second exemplary standard cell circuit according to a second embodiment of the invention.

FIG. 2 shows a second exemplary standard cell circuit according to a second embodiment of the invention. The standard cell circuit 200 may comprise at least an input node IN, an output node OUT, a standard cell unit (such as an inverter composed of transistors T1 and T2 as shown in FIG. 2) and at least a resistive device coupled to the standard cell unit for providing a resistive or a current path for a current to flow through. According to an embodiment of the invention, the resistive device may be any device that is capable of providing a current path or a resistive path to reduce the overall parasitic resistance of the standard cell circuit 200. For example, although the embodiment is not limited to this example, in one embodiment of the invention, the resistive device may be a transistor (also known as a dummy transistor).

The circuit shown in FIG. 2 is similar to that in FIG. 1, and is different in that, in the second embodiment of the invention, the gate of the dummy transistor TD1 is tied to zero (that is, a logic low or a low voltage) and the gate of the dummy transistor TD2 is tied to one (that is, a logic high or a high voltage). Therefore, in this embodiment, the dummy transistors TD1 and TD2 can be completely turned on, and the currents I2 and I2 can flow through to produce extra resistive or current paths in parallel with the resistors R1 and R2. In this manner, the parasitic resistance of the standard cell circuit 200 can be reduced.

Note that although the standard cell unit shown in FIG. 2 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 3:
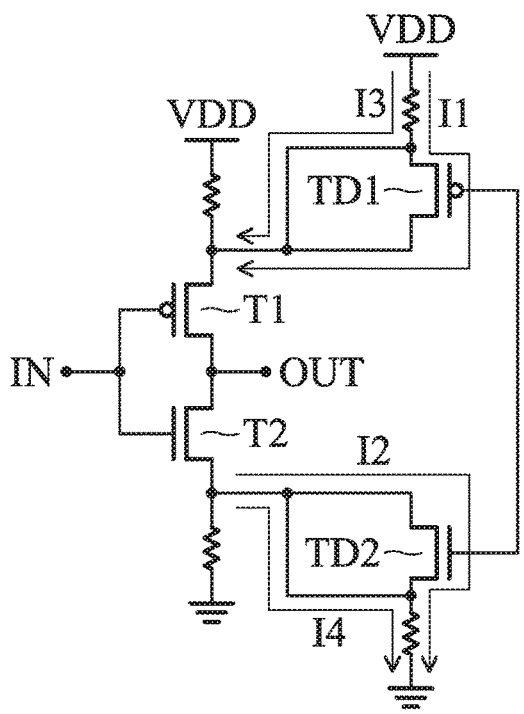
FIG. 3 shows a third exemplary standard cell circuit according to a third embodiment of the invention.

FIG. 3 shows a third exemplary standard cell circuit according to a third embodiment of the invention. The standard cell circuit 300 may comprise at least an input node IN, an output node OUT, a standard cell unit (such as an inverter composed of transistors T1 and T2 as shown in FIG. 3) and at least a resistive device coupled to the standard cell unit for providing a resistive or a current path for a current to flow through. According to an embodiment of the invention, the resistive device may be any device that is capable of providing a current path or a resistive path to reduce the overall parasitic resistance of the standard cell circuit 300. For example, although the embodiment is not limited to this example, in one embodiment of the invention, the resistive device may be a transistor (also known as a dummy transistor).

The circuit shown in FIG. 3 is similar to that in FIG. 1, and is different in that, in the third embodiment of the invention, the drain of the dummy transistor TD1 is further coupled to the source of the dummy transistor TD1 and the drain of the dummy transistor TD2 is further coupled to the source of the dummy transistor TD2. Since the gate of the dummy transistor TD1 is coupled to the gate of the dummy transistor TD2, the voltage at the gate electrodes of the dummy transistors TD1 and TD2 is floating. Therefore, in this embodiment, the dummy transistors TD1 and TD2 may not be completely turned on. However, as long as the dummy transistors TD1 and/or TD2 are/is turned on, the current I1 and/or I2 can flow through to produce one or more extra resistive or current paths in parallel with the resistor R1 and/or R2. In this manner, the parasitic resistance of the standard cell circuit 300 can be reduced.

In addition, in this embodiment, since the drain of the dummy transistor TD1 is further coupled to the source of the dummy transistor TD1 and the drain of the dummy transistor TD2 is further coupled to the source of the dummy transistor TD2, the dummy transistor TD1 further provides a current path for the current I3 to flow through, and the dummy transistor TD2 further provides a current path for the current I4 to flow through. In this manner, the parasitic resistance of the standard cell circuit 300 can further be reduced.

Note that although the standard cell unit shown in FIG. 3 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 4:
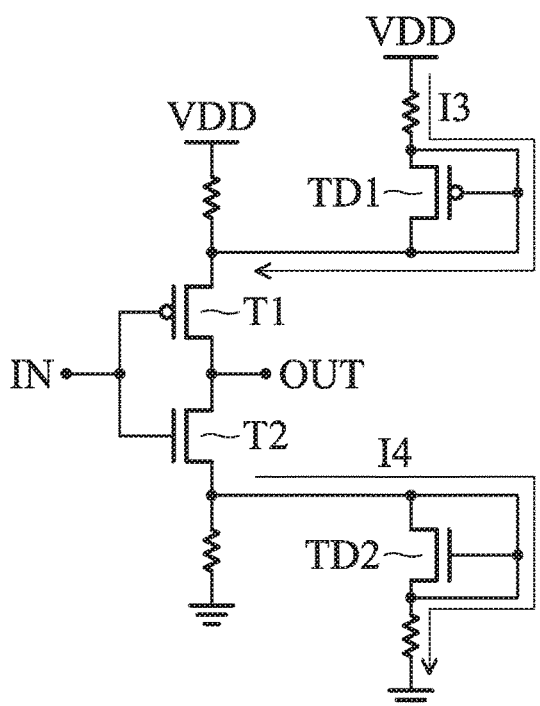
FIG. 4 shows a fourth exemplary standard cell circuit according to a fourth embodiment of the invention.

FIG. 4 shows a fourth exemplary standard cell circuit according to a fourth embodiment of the invention. The standard cell circuit 400 may comprise at least an input node IN, an output node OUT, a standard cell unit (such as an inverter composed of transistors T1 and T2 as shown in FIG. 4) and at least a resistive device coupled to the standard cell unit for providing a resistive or a current path for a current to flow through. According to an embodiment of the invention, the resistive device may be any device that is capable of providing a current path or a resistive path to reduce the overall parasitic resistance of the standard cell circuit 400. For example, although the embodiment is not limited to this example, in one embodiment of the invention, the resistive device may be a transistor (also known as a dummy transistor).

The circuit shown in FIG. 4 is similar to that in FIG. 1, and is different in that, in the fourth embodiment of the invention, the gate of the dummy transistor TD1 is decoupled from the gate of the dummy transistor TD2. In addition, the drain of the dummy transistor TD1 is further coupled to the source and gate of the dummy transistor TD1 and the drain of the dummy transistor TD2 are further coupled to the source and gate of the dummy transistor TD2. Therefore, in this embodiment, the dummy transistor TD1 provides a current path for the current I3 to flow through, and the dummy transistor TD2 further provides a current path for the current I4 to flow through. In this manner, the parasitic resistance of the standard cell circuit 400 can be reduced.

Note that although the standard cell unit shown in FIG. 4 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 5:
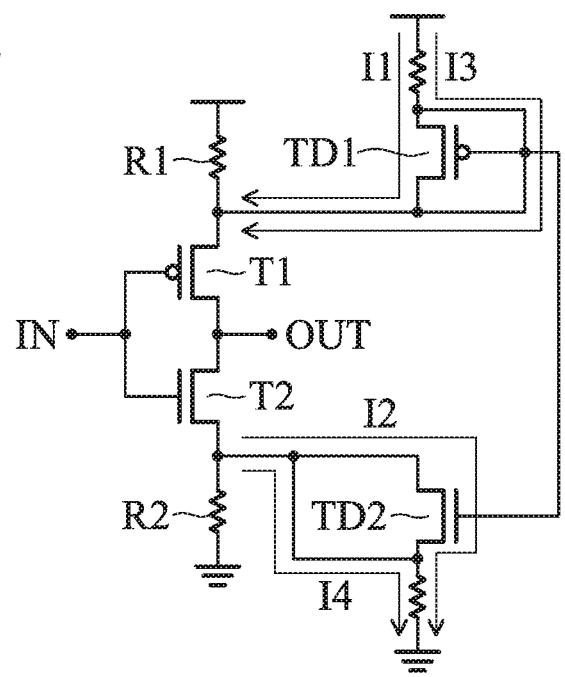
FIG. 5 shows exemplary standard cell circuit according to a sixth embodiment of the invention

FIG. 5 shows a fifth exemplary standard cell circuit according to a fifth embodiment of the invention. The standard cell circuit 500 may comprise at least an input node IN, an output node OUT, a standard cell unit (such as an inverter composed of transistors T1 and T2 as shown in FIG. 5) and at least a resistive device coupled to the standard cell unit for providing a resistive or a current path for a current to flow through. According to an embodiment of the invention, the resistive device may be any device that is capable of providing a current path or a resistive path to reduce the overall parasitic resistance of the standard cell circuit 500. For example, although the embodiment is not limited to this example, in one embodiment of the invention, the resistive device may be a transistor (also known as a dummy transistor).

The circuit shown in FIG. 5 is similar to that in FIG. 1, and is different in that, in the fifth embodiment of the invention, the drain of the dummy transistor TD1 is further coupled to the source and gate of the dummy transistor TD1 and the drain of the dummy transistor TD2 is further coupled to the source of the dummy transistor TD2. Since the gate of the dummy transistor TD1 is coupled to the gate of the dummy transistor TD2, the voltage at the gate electrodes of the dummy transistors TD1 and TD2 is floating. Therefore, in this embodiment, the dummy transistors TD1 and TD2 may not be completely turned on. However, as long as the dummy transistors TD1 and/or TD2 are/is turned on, the current I1 and/or I2 can flow through to produce one or more extra resistive or current paths in parallel with the resistors R1 and/or R2. In this manner, the parasitic resistance of the standard cell circuit 500 can be reduced. Note that in other embodiments of the invention, the gate of the dummy transistor TD1 and the gate of the dummy transistor TD2 may also be tied to zero (that is, a logic low or a low voltage) or one (that is, a logic high or a high voltage), and the invention should not be limited thereto.

In addition, in this embodiment, since the drain of the dummy transistor TD2 is further coupled to the source of the dummy transistor TD1 and the drain of the dummy transistor TD2 is further coupled to the source of the dummy transistor TD2, the dummy transistor TD1 further provides a current path for the current I3 to flow through, and the dummy transistor TD2 further provides a current path for the current I4 to flow through. In this manner, the parasitic resistance of the standard cell circuit 500 can further be reduced.

Note that although the standard cell unit shown in FIG. 5 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 6:
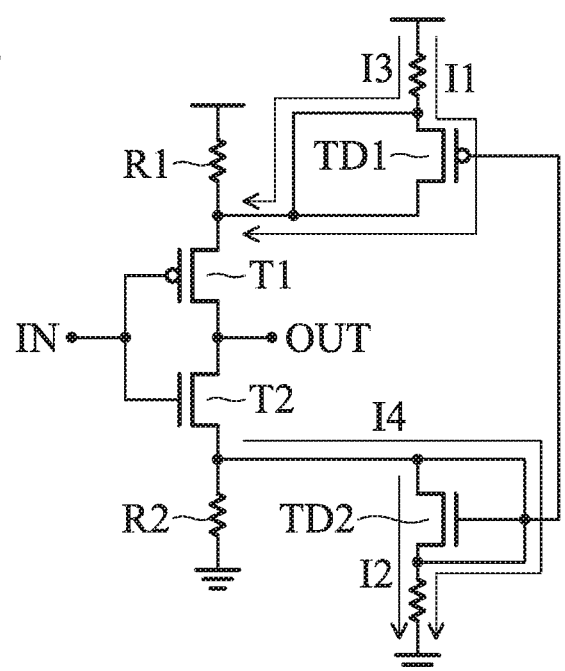
FIG. 6 shows a sixth exemplary standard cell circuit according to a sixth embodiment of the invention.

FIG. 6 shows a sixth exemplary standard cell circuit according to a sixth embodiment of the invention. The standard cell circuit 600 may comprise at least an input node IN, an output node OUT, a standard cell unit (such as an inverter composed of transistors T1 and T2 as shown in FIG. 6) and at least a resistive device coupled to the standard cell unit for providing a resistive or a current path for a current to flow through. According to an embodiment of the invention, the resistive device may be any device that is capable of providing a current path or a resistive path to reduce the overall parasitic resistance of the standard cell circuit 600. For example, although the embodiment is not limited to this example, in one embodiment of the invention, the resistive device may be a transistor (also known as a dummy transistor).

The circuit shown in FIG. 6 is similar to that in FIG. 1, and is different in that, in the sixth embodiment of the invention, the drain of the dummy transistor TD1 is further coupled to the source of the dummy transistor TD1 and the drain of the dummy transistor TD2 is further coupled to the source of the dummy transistor TD2. Since the gate of the dummy transistor TD1 is coupled to the gate of the dummy transistor TD2, the voltage at the gate electrodes of the dummy transistors TD1 and TD2 is floating. Therefore, in this embodiment, the dummy transistors TD1 and TD2 may not be completely turned on. However, as long as the dummy transistors TD1 and/or TD2 are/is turned on, the current I1 and/or I2 can flow through to produce one or more extra resistive or current paths in parallel with the resistors R1 and/or R2. In this manner, parasitic resistance of the standard cell circuit 600 can be reduced. Note that in other embodiments of the invention, the gate of the dummy transistor TD1 and the gate of the dummy transistor TD2 may also be tied to zero (that is, a logic low or a low voltage) or one (that is, a logic high or a high voltage), and the invention should not be limited thereto.

In addition, in this embodiment, since the drain of the dummy transistor TD2 is further coupled to the source of the dummy transistor TD1 and the drain of the dummy transistor TD2 is further coupled to the source of the dummy transistor TD2, the dummy transistor TD1 further provides a current path for the current I3 to flow through, and the dummy transistor TD2 further provides a current path for the current I4 to flow through. In this manner, the parasitic resistance of the standard cell circuit 600 can further be reduced.

Note that although the standard cell unit shown in FIG. 6 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 7:
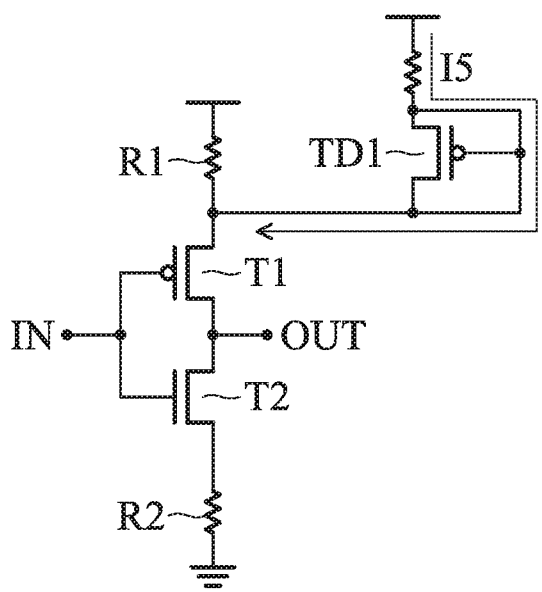
FIG. 7 shows a seventh exemplary standard cell circuit according to a seventh embodiment of the invention.

FIG. 7 shows a seventh exemplary standard cell circuit according to a seventh embodiment of the invention. The standard cell circuit 700 may comprise at least an input node IN, an output node OUT, a standard cell unit (such as an inverter composed of transistors T1 and T2 as shown in FIG. 7) and at least a resistive device coupled to the standard cell unit for providing a resistive or a current path for a current to flow through. According to an embodiment of the invention, the resistive device may be any device that is capable of providing a current path or a resistive path to reduce the overall parasitic resistance of the standard cell circuit 700. For example, although the embodiment is not limited to this example, in one embodiment of the invention, the resistive device may be a transistor also known as a dummy transistor).

In this embodiment, the dummy transistor TD1 is coupled between a source of the transistor T1 and a power supply and is coupled in parallel with the parasitic resistor R1 of the standard cell unit. A drain of the dummy transistor TD1 is coupled to the source of the transistor T1. The drain of the dummy transistor TD1 is further coupled to the source and gate of the dummy transistor TD1. The dummy transistor TD1 provides a resistive or current path in parallel with the resistor R1 for the current I5 to flow through. In this manner, the parasitic resistance of the standard cell circuit 700 can be reduced.

Note that although the standard cell unit shown in FIG. 7 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 8:
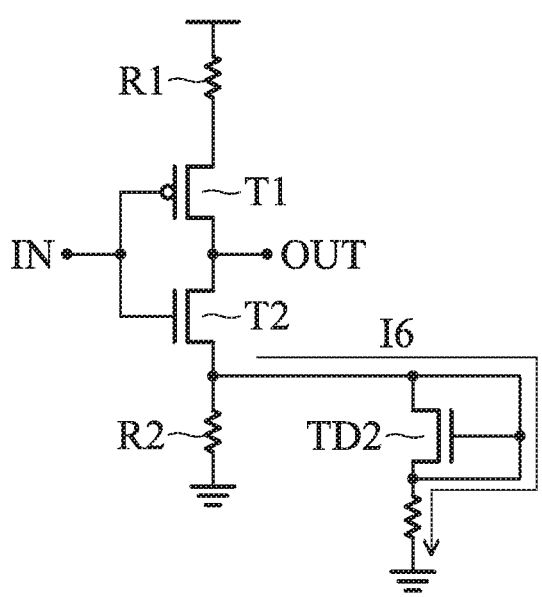
FIG. 8 shows an eighth exemplary standard cell circuit according to an eighth embodiment of the invention.

FIG. 8 shows an eighth exemplary standard cell circuit according to eighth embodiment of the invention. The standard cell circuit 800 may comprise at least an input node IN, an output node OUT a standard cell unit (such as an inverter composed of transistors T1 and T2 as shown in FIG. 8) and at least a resistive device coupled to the standard cell unit for providing a resistive or a current path for a current to flow through. According to an embodiment of the invention, the resistive device may be any device that is capable of providing a current path or a resistive path to reduce the overall parasitic resistance of the standard cell circuit 800. For example, although the embodiment is not limited to this example, in one embodiment of the invention, the resistive device may be a transistor (also known as a dummy transistor).

In this embodiment, the dummy transistor TD2 is coupled between a source of the transistor T2 and a ground and is coupled in parallel with the parasitic resistor R2 of the standard cell unit. A drain of the dummy transistor TD2 is coupled to the source of the transistor T2. The drain of the dummy transistor TD2 is further coupled to the source and gate of the dummy transistor TD2. The dummy transistor TD2 provides a resistive or current path in parallel with the resistor R2 for the current I6 to flow through. In this manner, the parasitic resistance of the standard cell circuit 800 can be reduced.

Note that although the standard cell unit shown in FIG. 8 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Note further that in some embodiments of the invention, multiple resistive devices may be applied to provide multiple resistive or current paths in parallel with the parasitic resistor(s) to reduce the parasitic resistance of the standard cell circuit.

Figure 9:
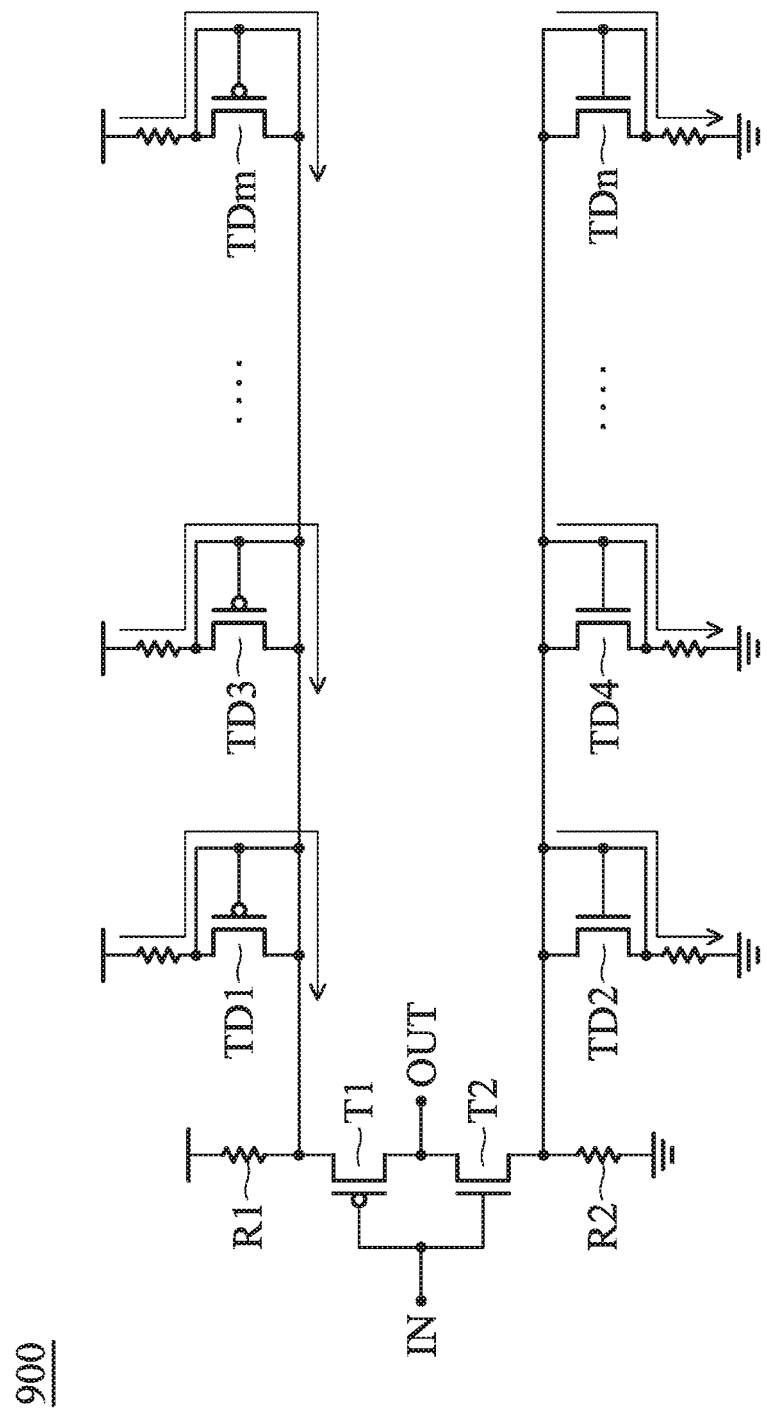
FIG. 9 shows a ninth exemplary standard cell circuit according to a ninth embodiment of the invention.

FIG. 9 shows a ninth exemplary standard cell circuit according to a ninth embodiment of the invention. The standard cell circuit 900 may comprise at least an input node IN, an output node OUT, a standard cell unit (such as an inverter composed of transistors T1 and T2 as shown in FIG. 9) and multiple resistive devices coupled to the standard cell unit for providing multiple resistive or current paths for current to flow through. According to an embodiment of the invention, the resistive device may be any device that is capable of providing a current path or a resistive path to reduce the overall parasitic resistance of the standard cell circuit 900. For example, although the embodiment is not limited to this example, in one embodiment of the invention, the resistive device may be a transistor (also known as a dummy transistor).

As shown in FIG. 9, the dummy transistors TD1, TD3, . . . TDm are coupled in parallel between a source of the transistor T1 and the power supply, and the transistors TD2, TD4, . . . TDn are coupled in parallel between a source of the transistor T2 and the ground, where m and n are positive integers, m is an odd number greater than 1 and n is an even number greater than 2. The dummy transistors TD1, TD3, . . . TDm and TD2, TD4, . . . TDn may provide multiple resistive or current paths for current to flow through, such as the arrows shown in FIG. 9. In this manner, the parasitic resistance of the standard cell circuit 900 can be reduced.

Note that although the standard cell unit shown in FIG. 9 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Note further that although in FIG. 9, the source, gate and drain of the dummy transistors are coupled together, the invention should not be limited thereto. A person of ordinary skill in the art can easily derive other layout structures of the standard cell circuit based on the illustrations given above, and can still make various alterations, combinations, and/or modifications without departing from the scope and spirit of this invention. Therefore, the scope of the present invention shall be defined and protected by the following claims and their equivalents.

Figure 10:
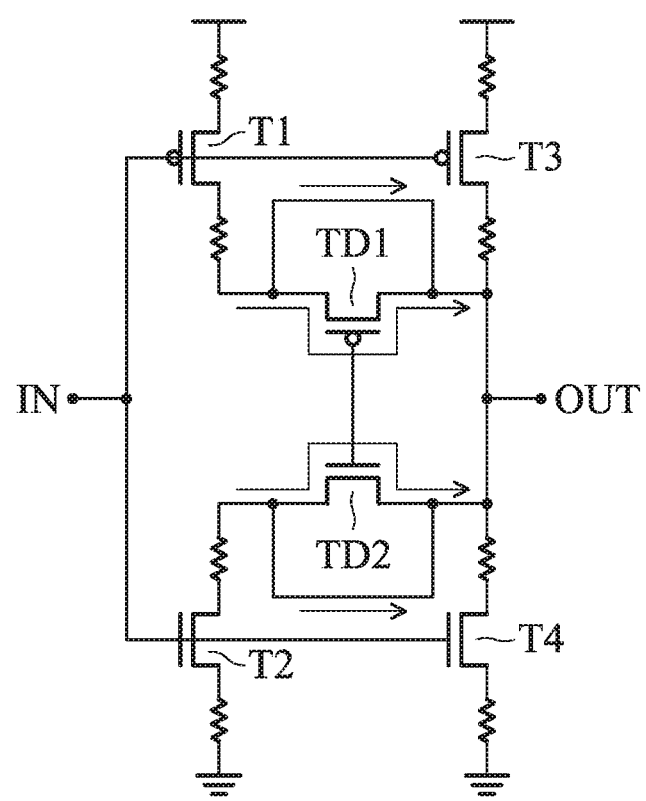
FIG. 10 shows a tenth exemplary standard cell circuit according to a tenth embodiment of the invention.

FIG. 10 shows a tenth exemplary standard cell circuit according to a tenth embodiment of the invention. The standard cell circuit 1000 may comprise at least an input node IN, an output node OUT, a standard cell unit (such as an inverter composed of transistors T1, T2, T3 and T4 as shown in FIG. 10) and at least one resistive device coupled to the standard cell unit for providing at least one resistive or current paths for a current to flow through. According to an embodiment of the invention, the resistive device may be any device that is capable of providing a current path or a resistive path to reduce the overall parasitic resistance of the standard cell circuit 1000. For example, although the embodiment is not limited to this example, in one embodiment of the invention, the resistive device may be a transistor (also known as a dummy transistor).

In the embodiment shown in FIG. 10, the inverter is designed as a double driving structure. The dummy transistor TD1 is coupled between a drain of the transistor T1 and a drain of the transistor T3 and the dummy transistor TD2 is coupled between a drain of the transistor T2 and a drain of the transistor T4. The gate of the dummy transistor TD1 is coupled to the gate of the dummy transistor TD2. The drain of the dummy transistor TD1 is further coupled to the source of the dummy transistor and the drain of the dummy transistor TD2 is further coupled to the source of the dummy transistor TD2. The dummy transistor TD1 may provide one or more resistive or current path, as the arrows shown in FIG. 10, to reduce the parasitic resistance coupled to the transistors T1 and T3, and the dummy transistor TD2 may also provide one or more resistive or current path, such as the arrows shown in FIG. 10, to reduce the parasitic resistance coupled to the transistors T2 and T4. In this manner, the parasitic resistance of the standard cell circuit 1000 can be reduced.

Note that although the standard cell unit shown in FIG. 10 is an inverter, the invention should not b limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), standard cell providing a storage function (flip-flop or latch), and others.

Figure 11:
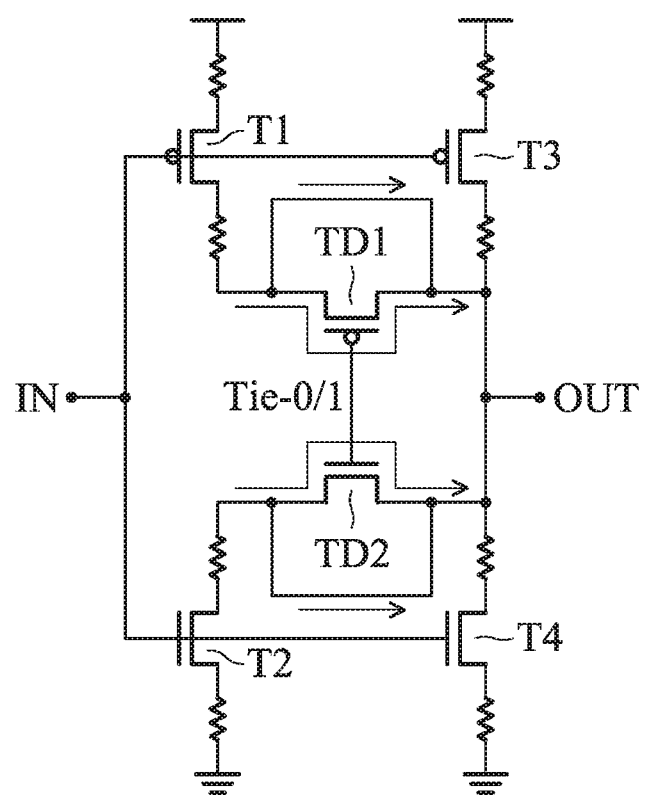
FIG. 11 shows an eleventh exemplary standard cell circuit according to an eleventh embodiment of the invention.

FIG. 11 shows an eleventh exemplary standard cell circuit according to an eleventh embodiment of the invention. The standard cell circuit 1100 may comprise at least an input node IN, an output node OUT, a standard cell unit (such as an inverter composed of transistors T1, T2, T3 and T4 as shown in FIG. 11) and at least one resistive device coupled to the standard cell unit for providing at least one resistive or current paths for a current to flow through. According to an embodiment of the invention, the resistive device may be any device that is capable of providing a current path or a resistive path to reduce the overall parasitic resistance of the standard cell circuit 1100. For example, although the embodiment is not limited to this example, in one embodiment of the invention, the resistive device may be a transistor (also known as a dummy transistor).

The circuit shown in FIG. 11 is similar to that in FIG. 10, and is different in that, in the eleventh embodiment of the invention, the gate of the dummy transistor TD1 and the gate of the dummy transistor TD2 are tied to zero (that is, a logic low or a low voltage) or tied to one (that is, a logic high or a high voltage). Therefore, in this embodiment, either one of the dummy transistors TD1 and TD2 can be completely turned on to provide one or more resistive or current path to reduce the parasitic resistance coupled to the transistors T1 and T3, and/or T2 and T4. In this manner, the parasitic resistance of the standard cell circuit 1100 can be reduced.

Note that although the standard cell unit shown in FIG. 11 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 12:
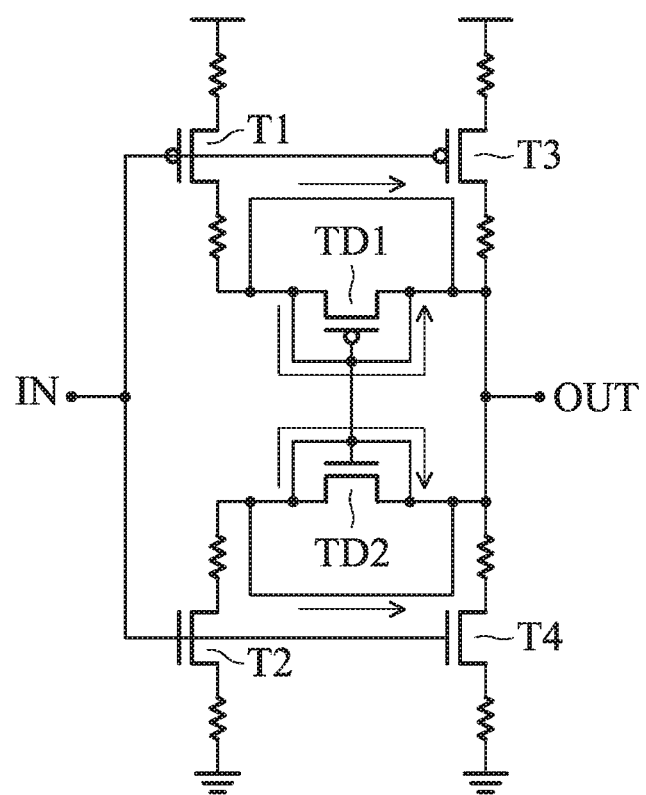
FIG. 12 shows a twelfth exemplary standard cell circuit according to a twelfth embodiment of the invention.

FIG. 12 shows a twelfth exemplary standard cell circuit according to a twelfth embodiment of the invention. The standard cell circuit 1200 may comprise at least an input node IN, an output node OUT, a standard cell unit (such as an inverter composed of transistors T1, T2, T3 and T4 as shown in FIG. 12) and at least one resistive device coupled to the standard cell unit for providing at least one resistive or current paths for a current to flow through. According to an embodiment of the invention, the resistive device may be any device that is capable of providing a current path or a resistive path to reduce the overall parasitic resistance of the standard cell circuit 1200. For example, although the embodiment is not limited to this example, in one embodiment of the invention, the resistive device may be a transistor (also known as a dummy transistor).

The circuit shown in FIG. 12 is similar to that in FIG. 10, and is different in that, in the twelfth embodiment of the invention, the drain of the dummy transistor TD1 is coupled to the source and gate of the dummy transistor TD1, and the drain of the dummy transistor TD2 is coupled to the source and gate of the dummy transistor TD2. The dummy transistor TD1 may provide one or more resistive or current path as the arrows shown in FIG. 12, to reduce the parasitic resistance coupled to the transistors T1 and T3, and the dummy transistor TD2 may also provide one or more resistive or current path, such as the arrows shown in FIG. 12, to reduce the parasitic resistance coupled to the transistors T2 and T4. In this manner, the parasitic resistance of the standard cell circuit 1200 can be reduced.

Note that although the standard cell unit shown in FIG. 12 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 13:
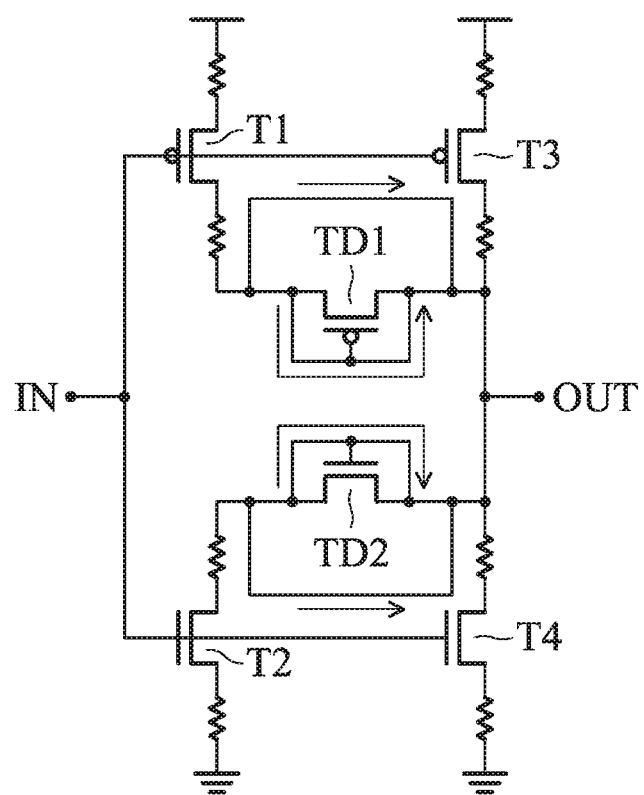
FIG. 13 shows a thirteenth exemplary standard cell circuit according to a thirteenth embodiment of the invention.

FIG. 13 shows a thirteenth exemplary standard cell circuit according to a thirteenth embodiment of the invention. The standard cell circuit 1300 may comprise at least an input node IN, an output node OUT, a standard cell unit (such as an inverter composed of transistors T1, T2, T3 and T4 as shown in FIG. 13) and at least one resistive device coupled to the standard cell unit for providing at least one resistive or current paths for a current to flow through. According to an embodiment of the invention, the resistive device may be any device that is capable of providing a current path or a resistive path to reduce the overall parasitic resistance of the standard cell circuit 1300. For example, although the embodiment is not limited to this example, in one embodiment of the invention, the resistive device may be a transistor (also known as a dummy transistor).

The circuit shown in FIG. 13 is similar to that in FIG. 12, and is different in that, in the thirteenth embodiment of the invention, the gate of the dummy transistor TD1 is de-coupled from the gate of the dummy transistor TD2. The dummy transistor TD1 may provide one or more resistive or current path, as the arrows shown in FIG. 13, to reduce the parasitic resistance coupled to the transistors T1 and T3, and the dummy transistor TD2 may also provide one or more resistive or current path, such as the arrows shown in FIG. 13, to reduce the parasitic resistance coupled to the transistors T2 and T4. In this manner, the parasitic resistance of the standard cell circuit 1300 can be reduced.

Note that although the standard cell unit shown in FIG. 13 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 14:
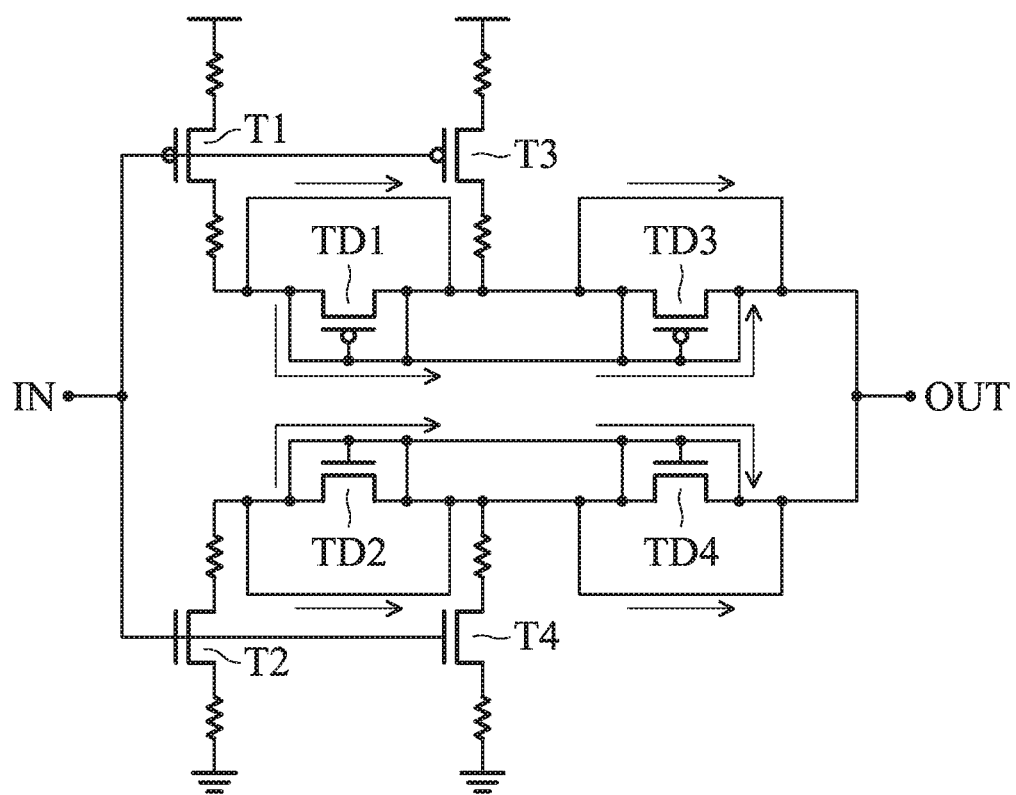
FIG. 14 shows a fourteenth exemplary standard cell circuit according to a fourteenth embodiment of the invention.

FIG. 14 shows a fourteenth exemplary standard cell circuit according to a fourteenth embodiment of the invention. The standard cell circuit 1400 may comprise at least an input node IN, an output node OUT, a standard cell unit (such as an inverter composed of transistors T1, T2, T3 and T4 as shown in FIG. 14) and multiple resistive devices coupled to the standard cell unit for providing multiple resistive or current paths for current to flow through. According to an embodiment of the invention, the resistive device may be any device that is capable of providing a current path or a resistive path to reduce the overall parasitic resistance of the standard cell circuit 1400. For example, although the embodiment is not limited to this example, in one embodiment of the invention, the resistive device may be a transistor (also known as a dummy transistor).

As shown in FIG. 14, the dummy transistor TD1 is coupled between a drain of the transistor T1 and a drain of the transistor T3, the dummy transistor TD3 is coupled between the drain of the transistor T3 and the output node OUT, the dummy transistor TD2 is coupled between a drain of the transistor T2 and a drain of the transistor T4, the dummy transistor TD4 is coupled between the drain of the transistor T4 and the output node OUT. The dummy transistors TD1, TD2, TD3 and TD4 may provide multiple resistive or current paths for current to flow through, such as the arrows shown in FIG. 14. In this manner, the parasitic resistance of the standard cell circuit 1400 can be reduced.

Note that although the standard cell unit shown in FIG. 14 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Note further that although in FIG. 14, the source, gate and drain of the dummy transistors are coupled together, the invention should not be limited thereto. A person of ordinary skill in the art can easily derive other layout structures of the standard cell circuit based on the illustrations given above, and can still make various alterations, combinations, and/or modifications without departing from the scope and spirit of this invention. Therefore, the scope of the present invention shall be defined and protected by the following claims and their equivalents.

Figure 15:
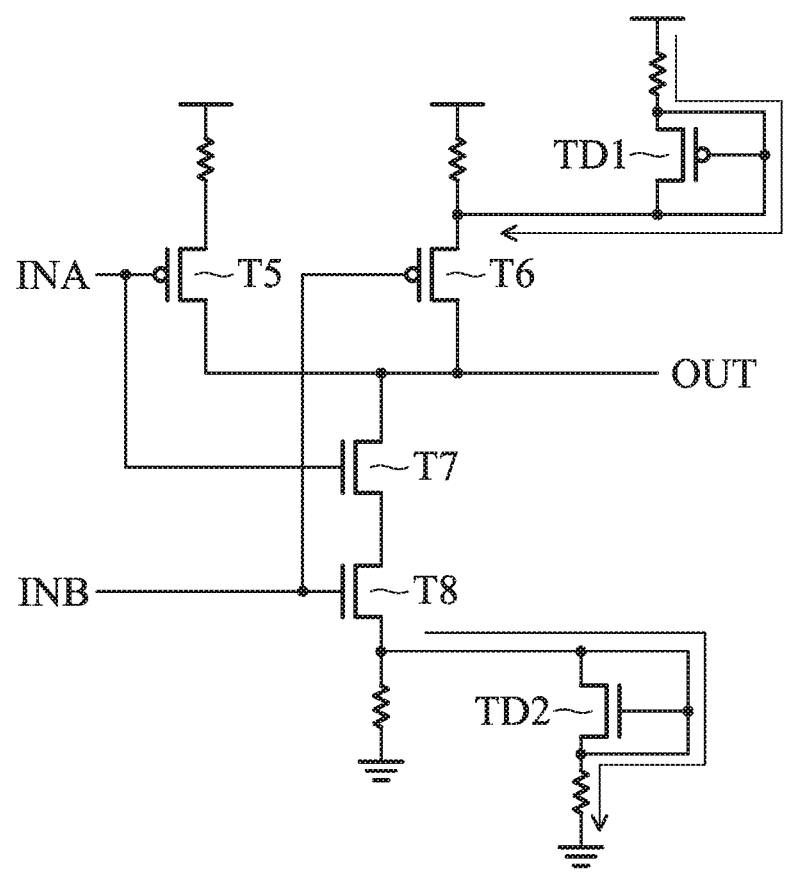
FIG. 15 shows a fifteenth exemplary standard cell circuit according to a fifteenth embodiment of the invention.

FIG. 15 shows a fifteenth exemplary standard cell circuit according to a fifteenth embodiment of the invention. The standard cell circuit 1500 may comprise at least two input nodes INA and INB, an output node OUT, a standard cell unit (such as an NAND gate composed of transistors T5, T6, T7 and T8 as shown in FIG. 15) and at least a resistive device coupled to the standard cell unit for providing multiple resistive or current paths for current to flow through. According to an embodiment of the invention, the resistive device may be any device that is capable of providing a current path or a resistive path to reduce the overall parasitic resistance of the standard cell circuit 1500. For example, although the embodiment is not limited to this example, in one embodiment of the invention, the resistive device may be a transistor (also known as a dummy transistor).

In the fifteenth embodiment of the invention, a dummy transistor TD1 is coupled between a source of the transistor T6 and a power supply and a dummy transistor TD2 is coupled between a source of the transistor T8 and the ground. A drain of the dummy transistor TD1 is coupled to the source of the transistor T6 and a drain of the dummy transistor TD2 is coupled to the source of the transistor T8. In addition, the drain of the dummy transistor TD1 is further coupled to the source and gate of the dummy transistor TD1 and the drain of the dummy transistor TD2 are further coupled to the source and gate of the dummy transistor TD2. Therefore, in this embodiment, the dummy transistor TD1 provides one or more current path(s) for the current to flow through, and the dummy transistor TD2 further provides one or more current path(s) or the current to flow through. In this manner, the parasitic resistance of the standard cell circuit 1500 can be reduced.

Note that although the standard cell unit shown in FIG. 15 is an NAND gate, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Figure 16:
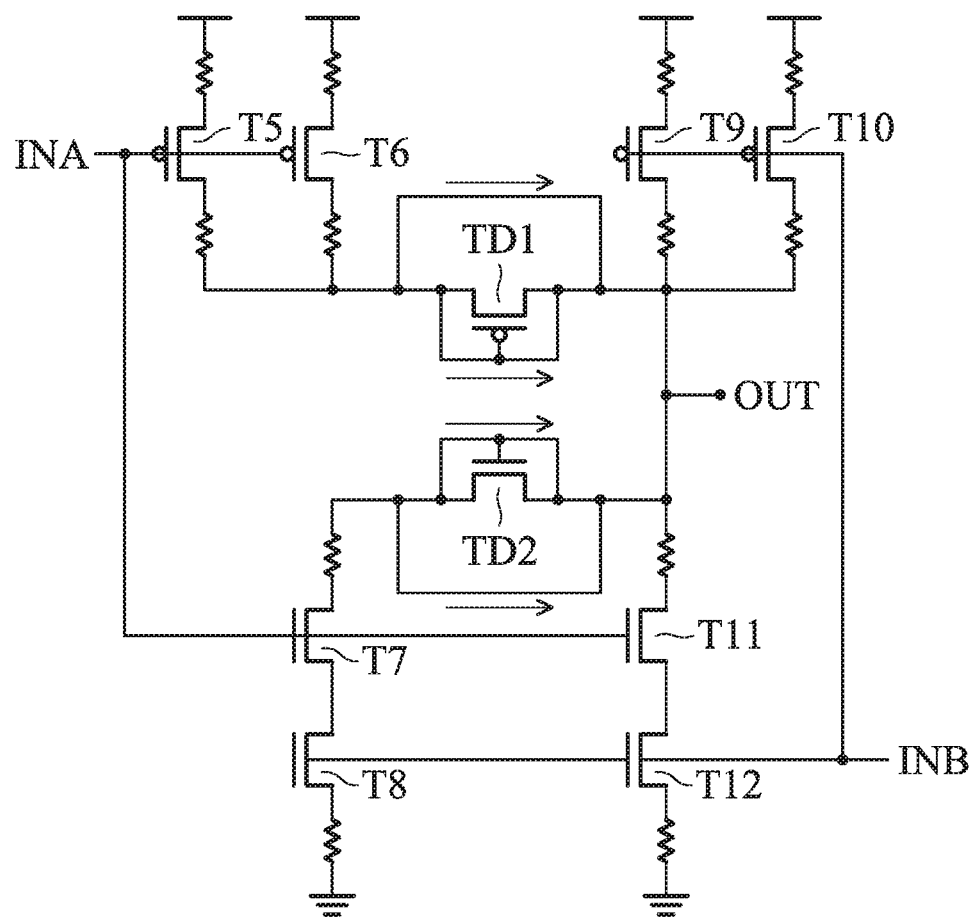
FIG. 16 shows a sixteenth exemplary standard cell circuit according to a sixteenth embodiment of the invention.

FIG. 16 shows a sixteenth exemplary standard cell circuit according to a sixteenth embodiment of the invention. The standard cell circuit 1600 may comprise at least two input nodes INA and INB, an output node OUT, a standard cell unit (such as an NAND gate composed of transistors T5, T6, T7, T8, T9, T10, T11 and T12 as shown in FIG. 16) and at least a resistive device coupled to the standard cell unit for providing multiple resistive or current paths for current to flow through. According to an embodiment of the invention, the resistive device may be any device that is capable of providing a current path or a resistive path to reduce the overall parasitic resistance of the standard cell circuit 1600. For example, although the embodiment is not limited to this example, in one embodiment of the invention, the resistive device may be a transistor (also known as a dummy transistor).

In the embodiment shown in FIG. 16, the NAND gate is designed as a double driving structure. The dummy transistor TD1 is coupled between the drains of the transistors T5, T6, T9 and T10, and the dummy transistor TD2 is coupled between a drain of the transistor T7 and a drain of the transistor T11. The drain of the dummy transistor TD1 is further coupled to the source and gate of the dummy transistor TD1, and the drain of the dummy transistor TD2 are further coupled to the source and gate of the dummy transistor TD2. The dummy transistor TD1 may provide one or more resistive or current path, as the arrows shown in FIG. 16, to reduce the parasitic resistance coupled to the transistors T5, T6, T9 and T10, and the dummy transistor TD2 may also provide one or more resistive or current path, such as the arrows shown in FIG. 16, to reduce the parasitic resistance coupled to the transistors T7, T8, T11 and T2. In this manner, the parasitic resistance of the standard cell circuit 1600 can be reduced.

Note that although the standard cell unit shown in FIG. 16 is an NAND gate, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND, OR, XOR, XNOR, inverters), the standard cell providing a storage function (flip-flop or latch), and others.

Note further that in some embodiments of the invention, the resistive device(s) may also be added to both the source and drain, or any internal node(s) of the transistor(s) comprised in a standard cell unit to reduce the parasitic resistance of the standard cell circuit.

Figure 17:
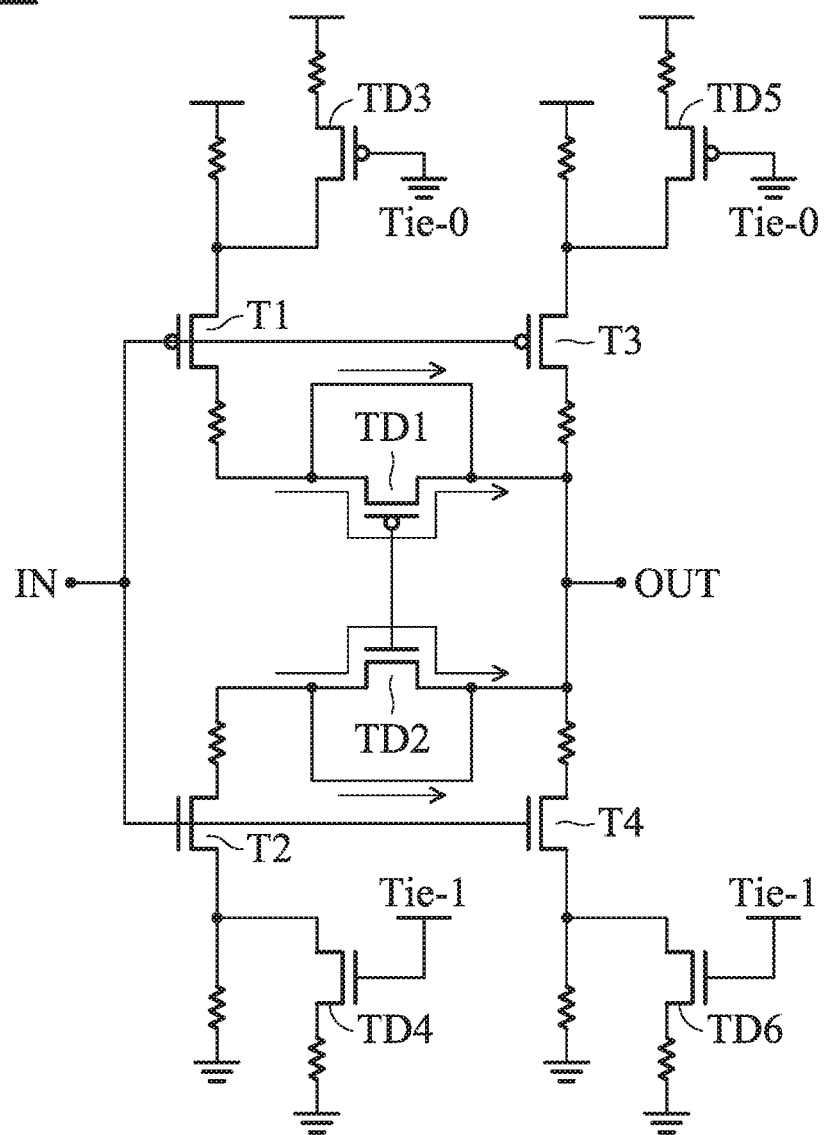
FIG. 17 shows a seventeenth exemplary standard cell circuit according to a seventeenth embodiment of the invention.

FIG. 17 shows a seventeenth exemplary standard cell circuit according to a seventeenth embodiment of the invention. The standard cell circuit 1700 may comprise at least an input node IN, an output node OUT, a standard cell unit (such as an inverter composed of transistors T1, T2, T3 and T4 as shown in FIG. 17) and at least one resistive device coupled to the standard cell unit for providing at least one resistive or current paths for a current to flow through. According to an embodiment of the invention, the resistive device may be any device that is capable of providing a current path or a resistive path to reduce the overall parasitic resistance of the standard cell circuit 1700. For example, although the embodiment is not limited to this example, in one embodiment of the invention, the resistive device may be a transistor (also known as a dummy transistor).

In the embodiment shown in FIG. 17, the inverter is designed as a double driving structure. The dummy transistor TD1 is coupled between a drain of the transistor T1 and a drain of the transistor T3 and the dummy transistor TD2 is coupled between a drain of the transistor T2 and a drain of the transistor T4. The gate of the dummy transistor TD1 is coupled to the gate of the dummy transistor TD2. The drain of the dummy transistor TD1 is further coupled to the source of the dummy transistor TD1, and the drain of the dummy transistor TD2 is further coupled to the source of the dummy transistor TD2.

In addition, the dummy transistor TD3 is coupled between a source of the transistor T1 and a power supply, the dummy transistor TD4 is coupled between a source of the transistor T2 and the ground, the dummy transistor TD5 is coupled between a source of the transistor T3 and a power supply and the dummy transistor TD6 is coupled between a source of the transistor T4 and the ground. A drain of the dummy transistor TD3 is coupled to the source of the transistor T1, a drain of the dummy transistor TD4 is coupled to the source of the transistor T2, a drain of the dummy transistor TD5 is coupled to the source of the transistor T3 and a drain of the dummy transistor TD6 is coupled to the source of the transistor T4. In addition, the gate of the dummy transistors TD3 and TD5 are tied to zero (that is, a logic low or a low voltage) and the gate of the dummy transistors TD4 and TD6 are tied to one (that is, a logic high or a high voltage).

The dummy transistors TD1~TD6 may respectively provide one or more resistive or current path to reduce the parasitic resistance comprised in the standard cell circuit. In this manner, the parasitic resistance of the standard cell circuit 1700 can be reduced.

Note that although the standard cell unit shown in FIG. 17 is an inverter, the invention should not be limited thereto. The concept of providing a resistive or current path to reduce the parasitic resistance of the standard cell unit as discussed above can be applied to any standard cell in the standard cell library, such as the standard cell providing a Boolean logic function (e.g., AND OR, XOR, XNOR, inverters), the standard cell providing a storage function (flip-flop or latch), and others. In addition, a person of ordinary skill in the art can easily derive other layout structures of the standard cell circuit based on the illustrations given above, and can still make various alterations, combinations, and/or modifications without departing from the scope and spirit of this invention. Therefore, the scope of the present invention shall be defined and protected by the following claims and their equivalents.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A standard cell circuit, comprising:
   a standard cell unit, coupled to at least one resistor and comprising a first MOS transistor; and
   a first resistive device, directly connected to a source of the first MOS transistor of the standard cell unit and providing a first current path for a first current to flow through;
   wherein the first resistive device comprises a first dummy transistor, and a source of the first dummy transistor is directly connected to a drain of the first dummy transistor, and wherein the first resistive device and the resistor are arranged in parallel.

2. The standard cell circuit as claimed in claim 1, wherein the first resistive device is connected between the source of the first MOS transistor and a power supply.

3. The standard cell circuit as claimed in claim 1 wherein the first resistive device is connected between the source of the first MOS transistor and a ground.

4. The standard cell circuit as claimed in claim 1, wherein the at least one resistor is parasitic resistor of the standard cell unit.

5. The standard cell circuit as claimed in claim 1, further comprising:
   a second resistive device, coupled to the standard cell unit and providing a second current path for a second current to flow through.

6. The standard cell circuit as claimed in claim 5, wherein the second resistive device is a transistor.

7. The standard cell circuit as claimed in claim 5, wherein the standard cell unit further comprises a second MOS transistor, and wherein the first resistive device is connected between the source of the first MOS transistor and a power supply, and the second resistive device is connected between a source of the second MOS transistor and a ground.

8. A standard cell circuit, comprising:
   a standard cell unit, coupled to at least one resistor and comprising a first MOS transistor; and
   a first dummy transistor, directly connected to a source of the first MOS transistor of the standard cell unit;
   wherein a source of the first dummy transistor is directly connected to a drain of the first dummy transistor, and wherein the first dummy transistor and the resistor are arranged in parallel.

9. The standard cell circuit as claimed in claim 8, wherein the first dummy transistor is connected between the source of the first MOS transistor and a power supply.

10. The standard cell circuit as claimed in claim 9, wherein the drain of the first dummy transistor is directly connected to the source of the first MOS transistor.

11. The standard cell circuit as claimed in claim 8, wherein the first dummy transistor is connected between the source of the first MOS transistor and a ground.

12. The standard cell circuit as claimed in claim 11, wherein the drain of the first dummy transistor is directly connected to the source of the first MOS transistor.

13. The standard cell circuit as claimed in claim 8, further comprising:
   a second dummy transistor, coupled to the standard cell unit.

14. The standard cell circuit as claimed in claim 13, wherein the standard cell unit further comprises a second MOS transistor, and wherein the first dummy transistor is connected between the source of the first MOS transistor and a power supply, and the second dummy transistor is coupled between a source of the second MOS transistor and a ground.

15. The standard cell circuit as claimed in claim 8, wherein the at least one resistor is parasitic resistor of the standard cell unit.

* * * * *